United States Patent [19]

Kuraishi

[11] Patent Number: 4,843,393
[45] Date of Patent: Jun. 27, 1989

[54] D/A CONVERTER

[75] Inventor: Yoshiaki Kuraishi, Tokyo, Japan

[73] Assignee: NEC Corporation, Japan

[21] Appl. No.: 235,771

[22] Filed: Aug. 24, 1988

Related U.S. Application Data

[63] Continuation of Ser. No. 38,951, Apr. 16, 1987, abandoned.

[30] Foreign Application Priority Data

Apr. 17, 1986 [JP] Japan .................................. 61-88639

[51] Int. Cl.$^4$ .............................................. H03M 1/80
[52] U.S. Cl. ...................................... 341/150; 341/145; 341/146; 341/153
[58] Field of Search ................ 341/146, 150, 153, 145, 341/164, 165, 172

[56] References Cited

U.S. PATENT DOCUMENTS 4,077,035 2/1978 Yee .
4,611,195 9/1986 Shosaku ........................ 340/347 DA

OTHER PUBLICATIONS

"Integrated PCM Codec", Reprinted from IEEE J. Solid-State Circuits, vol. SC-14, pp. 38-46, Feb. 1979.

Primary Examiner—William M. Shoop, Jr.
Assistant Examiner—Marc S. Hoff
Attorney, Agent, or Firm—Leydig, Voit & Mayer

[57] ABSTRACT

A D/A converter includes a first stage capacitor ladder, a second stage capacitor ladder, a coupling capacitor, (1+m) switches, and a short-circuiting switch. The first stage capacitor ladder includes l capacitors having one side electrodes commonly connected to a first point and capacitances binary-increased from $2^0.C$ to $2^{l-1}.C$ (l is a natural number and C is a unit capacitance). The second stage capacitor ladder includes m capacitors having one side electrodes commonly connected to a second point and capacitances binary-increased from $2^0.C$ to $2^{m-1}.C$ (m is a natural number). The coupling capacitor has a capacitance of 1.C and is connected between the first and second points. The (1+m) switches selectively connects another side electrodes of the (1+m) capacitors to a first or second reference voltage in response to an (1+m)-bit digital input signal. The short-circuiting switch is connected between the first reference voltage and the first point of the first stage capacitor ladder.

3 Claims, 2 Drawing Sheets

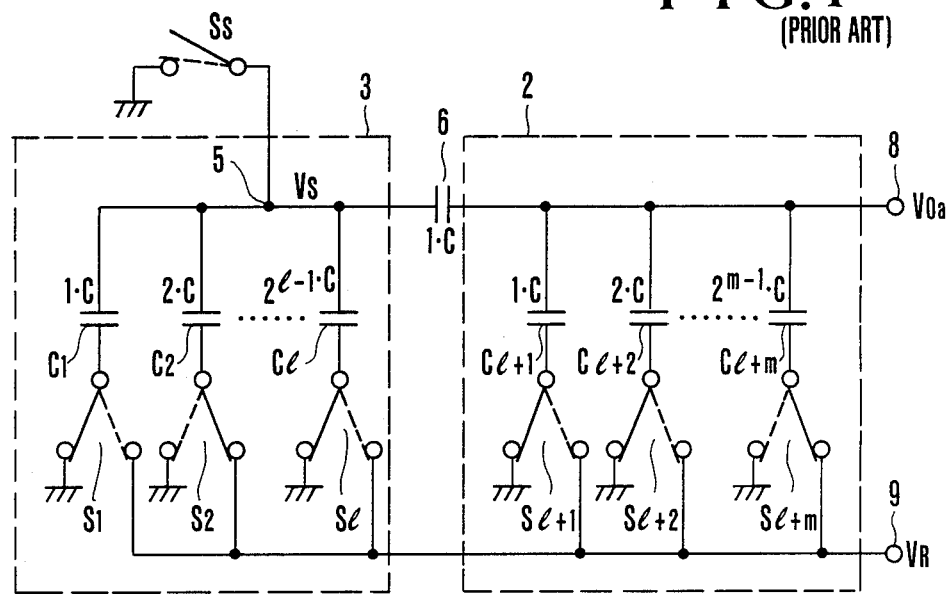
F I G. 2

D/A CONVERTER

This application is a continuation of application Ser. No. 07/038,951 filed Apr. 16, 1987, now abandoned.

BACKGROUND OF THE INVENTION

The present invention relates to a D/A (Digital-to-Analog) converter and, more particularly, to a D/A converter using a two-stage binary weighted capacitor ladder network.

A D/A converter using a binary weighted capacitor ladder network is suitable for an integrated D/A converter. Such a D/A converter using a two-stage weighted capacitor network has advantages in a smaller number of unit capacitors, a smaller occupying area on a D/A converter IC, and low fabrication cost as compared with a one-stage weighted capacitor network. U.S. Pat. No. 4,077,035 (Feb. 28, 1978) describes a two-stage binary weighted capacitor network comprising an integrator and two similar groups of capacitors connected in parallel. However, this network requires an operational amplifier since the network includes the integrator, resulting in a complicated circuit arrangement and large current consumption.

Another conventional D/A converter using a two-stage binary weighted capacitor network as shown in FIG. 1 is described in "Integrated PCM Codec", IEEE Journal Solid State Circuits, SC-14, PP. 38–46, Feb. 1979. This D/A converter does not include an operational amplifier.

Referring to FIG. 1, capacitors $C_0$ to $C_l$ constitute a first stage capacitor ladder 1. These capacitors $C_0$ to $C_l$ have binary weighted capacitances as follows: $C_0 = 1.C$, $C_1 = 2^0.C$, $C_2 = 2^1.C$, $C_3 = 2^2.C$, ... $C_l = 2^{l-1}.C$ where C is the capacitance of the unit capacitor. Capacitors $C_{l+1}$ to $C_{l+m}$ constitute a second stage capacitor ladder 2. These capacitors $C_{l+1}$ to $C_{l+m}$ have binary weighted capacitances as follows: $C_{l+1} = 2^0.C$, $C_{l+2} = 2^1.C$, $C_{l+3} = 2^2.C$, ... $C_{l+m} = 2^{m-1}.C$. The first and second capacitor ladders are coupled by a coupling capacitor $C_c$ of a capacitance $C_c.C$ to constitute a two-stage binary weighted capacitor network. One of the electrodes of the capacitances $C_1$ to $C_l$ and $C_{l+1}$ to $C_{l+m}$ is grounded or connected to a reference voltage $V_R$ through a corresponding one of switches $S_1$ to $S_l$ and $S_{l+1}$ to $S_{l+m}$. The switches $S_1$ to $S_l$ are controlled by less significant l bits of a digital input signal. The switches $S_{l+1}$ to $S_{l+m}$ are controlled by more significant m bits of the digital input signal. The D/A converter serves as an $(l+m)$-bit D/A converter.

An output voltage $V_0$ of the D/A converter shown in FIG. 1 is calculated on the basis of charge conservation as follows:

$$V_0 = \left[ \left( C_c \sum_{k=1}^{l} b_k \cdot 2^{k-1} \right) / \{(2^l + C_c)(2^m - 1 + C_c) - C_c^2\} + \left( (2^l + C_c) \sum_{k=1}^{m} b_{l+k} \cdot 2^{k-1} \right) / \{(2^l + C_c)(2^m - 1 + C_c) - C_c^2\} \right] V_R \quad (1)$$

where $b_k$ is the coefficient of 0 or 1 determined in response to an $(ll+m)$-bit digital input signal, and $V_R$ is the reference voltage. In order to arrange the circuit as the $(l+m)$-bit D/A converter, the coupling capacitance $C_c$ must be given as follows:

$$C_c = \{2^l/(2^l-1)\}C \quad (2)$$

If equation (2) is satisfied, a substitution of equation (2) into equation (1) yields the output voltage $V_0$ as follows:

$$V_0 = (V_R/2^{l+m}) \left\{ \sum_{k=1}^{l} b_k \cdot 2^{k-1} + 2^l \sum_{k=1}^{m} b_{l+k} \cdot 2^{k-1} \right\} \quad (3)$$

Equation (3) can be rewritten as follows:

$$V_0 = (V_R/2^{l+m}) \{b_1 \cdot 2^0 + b_2 \cdot 2^1 + \ldots + b_l \cdot 2^{l-1} + b_{l+1} \cdot 2^l + \ldots + b_{l+m} \cdot 2^{l+m-1}\} = (V_R/2^{l+m}) \sum_{k=1}^{l+m} b_k \cdot 2^{k-1} \quad (4)$$

therefore, the analog output voltage $V_0$ corresponding to the $(l+m)$-bit binary digital signal is obtained. The circuit in FIG. 1 serves as the $(l+m)$-bit D/A converter if the following condition is satisfied:

$$C_c\{2^l/(2^l-1)\}C$$

However, it is difficult to obtain the coupling capacitance $C_c$ which constantly and perfectly satisfies equation (2).

For example, if $l=6$, then $$C_c/C = 2^6/(2^6-1) = 64/63 = 1.01587$$

It is difficult to accurately obtain the $C_c$ value, and thus precise digital-to-analog conversion precision cannot be obtained.

SUMMARY OF THE INVENTION

It is an object of the present invention to eliminate the conventional drawback described above and to provide a highly precise D/A converter using a two-stage binary weighted capacitor network.

Accordingly, the present invention provides a D/A converter for converting a $(l+m)$-bit digital input signal to an analog signal, whereboth l and m are natural numbers, the D/A converter comprising a first stage capacitor ladder which converts the less significant l bits of the $(l+m)$-bit digital input signal and includes l capacitors having one side electrodes thereof commonly connected a first point and capacitances binary-increased from $2^0.C^2$ to $1-1^{-1}C$ where C is a unit capacitance; a second stage capacitor ladder which converts the more significant m bits of the $(l+m)$-bit digital input signal and includes m capacitors having one side electrodes thereof commonly connected to a second point and capacitances binary-increased from $2^0.C$ to $2^{m-1}.C$; a coupling capacitor having a capacitance of 1.C and connected between the first and second points; $(l+m)$ switches connected with another side electrode of the $(l+m)$ capacitors in one-to-one correspondence for selectively connecting the another side electrodes of the $(l+m)$ capacitors to a first or second reference voltage in response to the $C(l+m)$-bit digital input signal; and a short-circuiting switch connected between the first reference voltage and the first point of the first stage capacitor ladder.

BRIEF DESCRIPTION OF THE DRAWINGS

FIG. 2 is a circuit diagram showing an arrangement of a D/A converter according to an embodiment of the present invention.

DETAILED DESCRIPTION OF THE PREFERRED EMBODIMENT

A preferred embodiment of the present invention will be described with reference to the accompanying drawings.

Figure 1:
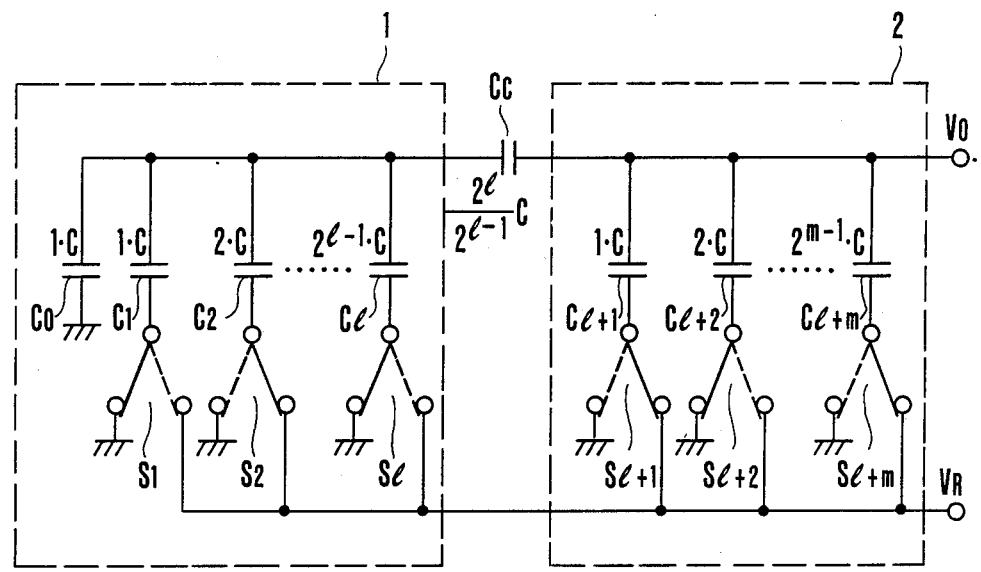
FIG. 1 is a circuit diagram showing an arrangement of a conventional D/A converter.

FIG. 2 is a circuit diagram showing an arrangement of a D/A converter according to an embodiment of the present invention. The same reference numerals as in FIG. 1 denote the same parts in FIG. 2. Referring to FIG. 2, capacitors $C_1$ to $C_l$ constitute a first capacitor ladder 3 and have binary weighted capacitances as follows:

$$C_1 = 2^0 \cdot C, \ C_2 = 2^1 \cdot C, \ C_3 = 2^2 \cdot C, \ldots C_l = 2^{l-1} \cdot C.$$

Capacitors $C_{l+1}$ to $C_{l+m}$ constitute a second capacitor ladder 2 and have binary weighted capacitors as follows:
$C_{l+1} = 2^0 \cdot C, \ C_{l+2} = 2^1 \cdot C, \ C_{l+3} = 2^2 \cdot C, \ldots C_{l+m} 32 \ 2^{m-1} \cdot C.$ One electrode of each of the capacitors $C_1$ to $C_l$ is connected to a common connecting point 5. The common connecting point 5 is connected to one terminal of a short-circuiting switch $S_s$, the other terminal of which is grounded. The common connecting point 5 is also connected to one electrode of a coupling capacitor 6 having a capacitance $1 \cdot C$. The other electrode of the coupling capacitor 6 is connected to an output terminal 8 to which one electrode of each of the capacitors $C_{l+1}$ to $C_{l+m}$ of the second capacitor ladder 2 is connected. The other electrode of each of the capacitors $C_1$ to $C_{l+m}$ is grounded or connected to a reference voltage terminal 9 through a corresponding one of switches $S_1$ to $S_{l+m}$ in response to a digital input signal. The switches $S_1$ to $S_l$ are controlled by less significant l bits of the digital input signals and select a reference voltage $V_R$ or a ground potential. The switches $S_{l+1}$ to $S_{l+m}$ are controlled by more significant m bits of the digital input signal and select the reference voltage $V_R$ or the ground potential. The short-circuiting switch $S_s$ is driven and closed while the second capacitor ladder 2 is operated.

The characteristic feature of the present invention lies in the facts that the capacitance of the coupling capacitor 6 is set to be $1C$ and the first capacitor ladder 3 includes the capacitors $C_1$ to $C_l$ and the short-circuiting switch $S_s$.

The operation of the D/A converter according to this embodiment will be described below. In this embodiment, D/A conversion is performed in two steps. When more significant m bits of the digital input signal are input to the second capacitor ladder 2, the switches $S_{l+1}$ to $S_{l+m}$ are operated. In this case, the short-circuiting switch $S_s$ is closed and the common connecting point 5 of the first capacitor ladder 3 is grounded. At the same time, the switches $S_1$ to $S_l$ select the ground potential. When the operation of the second capacitor ladder 2 is completed, the short-circuiting switch $S_s$ is opened. The switches $S_1$ to $S_l$ select the reference voltage $V_R$ or the ground potential in response to the less significant l bits of the digital input signal. In this case, the switches $S_{l+1}$ to $S_{l+m}$ hold the previous operation stage.

The output voltage generated by the D/A converter according to this embodiment of the present invention will be described. If the output voltage is defined as $V_0'$ when it is generated in response to the more significant m bits of the digital input signal supplied to the second capacitor ladder 2, the output voltage $V_0'$ is calculated for the second capacitor ladder 2 as follows since the switch $S_s$ is closed and the common connecting point 5 is grounded:

$$V_0' = (V_R/2^m) \sum_{k=1}^{m} b_k \cdot 2^{k-1} \tag{5}$$

A voltage $V_s$ is calculated as follows when the lower bits of the digital input signal are input to the first capacitor ladder 3:

$$V_s = \{V_R/(2^l - \tfrac{1}{2}^m)\} \sum_{k=1}^{m} b_k \cdot 2^{k-1} \tag{6}$$

therefore, a final output voltage $V_{0a}$ is defined by:

$$\begin{aligned}
V_{0a} &= (V_R/2^m)\left( V_s/V_R + \sum_{k=1}^{m} b_k \cdot 2^{k-1} \right) \\
&= (V_R/2^{l+m})\left( 1/(1 - \tfrac{1}{2}^{l+m}) \sum_{k=1}^{l} b_k \cdot 2^{k-1} + 2^l \sum_{k=1}^{m} b_k \cdot 2^{k-1} \right)
\end{aligned} \tag{7}$$

In equation (7), since the following condition is given:

$$1 >> \tfrac{1}{2}^{l+m}$$

then $$1/(1 - \tfrac{1}{2}^{l+m}) \approx 1 \tag{8}$$

Equation (7) is given in the same manner as for equation (3) and can be rewritten into equation (9) as for equation (4):

$$\begin{aligned}
V_{0a} &\approx (V_R/2^{l+m})\left( \sum_{k=1}^{l} b_k \cdot 2^{k-1} + 2^l \sum_{k=1}^{n} b_k \cdot 2^{k-1} \right) \\
&= (V_R/2^{l+m}) \sum_{k=1}^{l+m} b_k \cdot 2^{k-1}
\end{aligned} \tag{9}$$

The D/A converter according to this embodiment serves as the $(l+m)$-bit D/A converter.

An error $V_e$ generated by approximation using equation (8) will be calculated below:

$$\begin{aligned}
V_e &= V_0 - V_{0a} \\
&= (V_R/2^{l+m}) \sum_{k=1}^{l} b_k \cdot 2^{k-1} \{1/(2^{l+m} - 1)\}
\end{aligned} \tag{10}$$

A maximum value $V_{em}$ of the error $V_e$ is obtained for $b_k = 1$ wherein $k = 1$ to $l$:

$$V_{em} = (V_R/2^{l+m}) \cdot 2^l \cdot \{\tfrac{1}{2}^{l+m} - 1)\} \tag{11}$$

A minimum step voltage $V_{LSB}$ of the D/A converter is $V_R/2^{l+m}$ and the maximum value $V_{em}$ is thus given by equation (12):

$$V_{em} = V_{LSB} \cdot 2^l \cdot \{1/(2^{l+m} - 1)\}$$

$$= \{1/(2^m - \tfrac{1}{2^l})\} V_{LSB} < V_{LSB} \quad (12)$$

For example, if $l=6$ and $m=6$, then $$V_{3m} = \{1/(2^6 - \tfrac{1}{2^6})\} V_{LSB}$$

$$\approx V_{LSB}/64 << V_{LSB}$$

Therefore, the error by approximation using equation (8) is negligible in practice.

Figure 3:
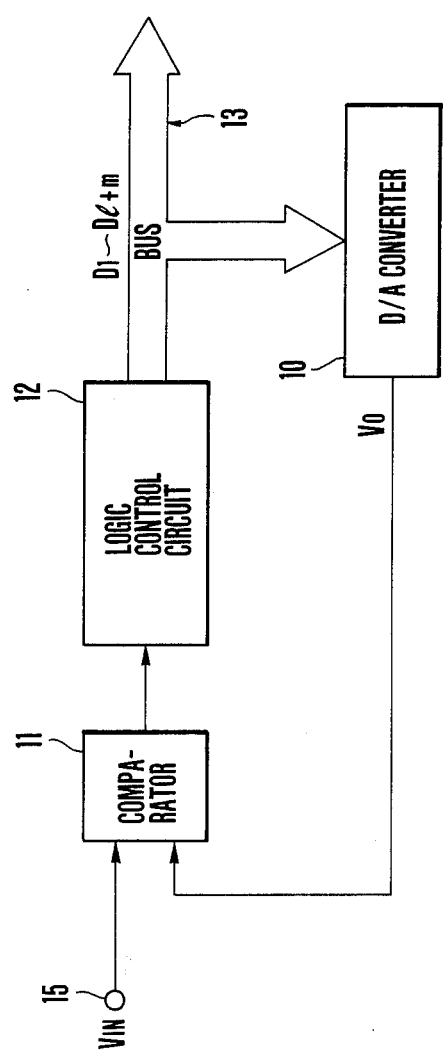
FIG. 3 is a block diagram showing an application of the D/A converter shown in FIG. 2.

FIG. 3 is a successive approximation A/D converter system as an application of the D/A converter shown in FIG. 2. Reference numeral 10 in FIG. 3 denotes an $(l+m)$-bit D/A converter shown in FIG. 2. The D/A converter 10 generates an output $V_0$. A comparator 11 compares an analog input $V_{IN}$ from an input terminal 15 with the output $V_0$ from the D/A converter 10. A logic control circuit 12 outputs control signal bits $D_1$ to $D_{m+l}$ through a bus 13 so as to cause the D/A converter 10 to generate the predetermined analog output $V_0$.

In operation of the circuit in FIG. 3, the control signal bits $D_1$ to $D_{l+m}$ (1000 ... 000) are supplied from the logic control circuit 12 to the D/A converter 10, and the D/A converter 10 generates an analog signal corresponding to $V_0 = V_R/2$. The comparator 11 compares the analog signal $V_0$ with the analog input $V_{IN}$. If $V_{IN} > V_0$, then the most significant bit (MSB) is set to be logic "1". However, if $V_{IN} < V_0$, then the MSB is set to be logic "0". In the next step, the bits $D_1$ to $D_{l+m}$ are set to be a binary code "1100 ... 00" or "0100 ... 00". In this case, the D/A converter 10 generates $V_0 = 3V_R/4$ or $V_R/4$. The output $V_0$ is compared with the analog input $V_{IN}$ to determine the second bit. The above voltage comparison cycle is repeated $(l+m)$ times to determine the logic levels of the bits from the MSB to the LSB (Least Significant Bit). Therefore, the analog input $V_{IN}$ is converted into the corresponding signal bits $D_1$ to $D_{m+l}$.

The above operation is called successive approximation. By using this scheme, the first capacitor ladder is operated in response to the less significant bits of the input signal after the second capacitor ladder is operated in response to the upper bits, which is the characteristic feature of the D/A converter of the present invention. In this operation, no problem is presented because the less significant bits can be fixed while sequential comparison is started from the more significant bits bit by bit. In other words, a successive approximation A/D converter may be constituted by using the D/A converter according to the present invention.

According to the present invention as described above, in a D/A converter using a two-stage capacitor ladder network, the two capacitor ladders are capacitively coupled by a unit capacitor having the same capacitance C as that constituting the capacitor ladders. As a result, there is provided a highly precise D/A converter wherein precision of the coupling capacitance can be improved and conversion errors can be reduced.

What is claimed is:

1. A D/A converter converting a $(l+m)$-bit digital input signal to an analog signal, where both l and m are natural numbers, the D/A converter comprising:
   a first stage capacitor ladder which converts the less significant l bits of the $(l+m)$-bit digital input signal and includes l capacitors having one side electrodes thereof commonly connected to a first point and capacitances binary-increased from $2^0 \times C$ to $2^{l-1} \times C$, where C is a unit capacitance;
   a second stage capacitor ladder which converts the more significant m bits of the $(l+m)$-bit digital input signal and includes m capacitors having one side electrodes thereof commonly connected to a second point and capacitances binary-increased from $2^0 \times C$ to $2^{m-1} \times C$;
   a coupling capacitor having a capacitance of $1 \times C$ and connected between said first and second points;
   $(l+m)$ switches connected with another side electrodes of said $(l+m)$ capacitors in one-to-one correspondence for selectively connecting the another side electrodes of said $(l+m)$ capacitors to a first or second reference voltage in response to the $(l+m)$-bit digital input signal; and
   a short-circuiting switch connected between the first reference voltage and said first point of said first stage capacitor ladder.

2. A converter according to claim 1, wherein said short-circuiting switch is controlled to be turned on to enable said first stage capacitor ladder when the more significant m bits of the digital signal are input to said second stage capacitor ladder and is controlled to be turned off to enable said first stage capacitor ladder and to cause it to convert less significant l bits of the digital signal when inputting of the more significant m bits of the digital signal to said second stage capacitor ladder is completed.

3. A D/A converter for converting a digital signal of $(l+m)$ bits to an analog signal, where both l and m are natural numbers, the D/A converter comprising:
   l capacitors corresponding to the less significant l bits of the digital signal and having one side electrodes thereof commonly connected to a first point and capacitances binary-increased from $2^0 \times C$ to $2^{l-1} \times C$, where C is a unit capacitance;
   m capacitors corresponding to the more significant m bits of the digital signal and having one side electrodes thereof commonly connected to a second point and capacitances binary-increased from $2^0 \times C$ to $2^{m-1} \times C$;
   a coupling capacitor having a capacitance of $1 \times C$ and connected between said first and second points;
   l switches for selectively connecting the another side electrodes of said l capacitors to a voltage source or the ground to input the less significant l bits of the digital signal;
   m switches for selectively connecting the another electrodes of said m capacitors to the voltage source or the ground to input the more significant m bits of the digital signal; and
   a short-circuiting switch connected between the first point and the ground,
   said short-circuiting switch, said l switches and said m switches being controlled such that, at first, said short-circuiting switch is closed and the more significant m bits of the digital signal are inputted by operating said m switches, then the short-circuiting switch is opened and the less significant l bits of the digital signal are inputted by operating said l switches.

* * * * *